US010393818B2

(12) United States Patent
Din et al.

(10) Patent No.: US 10,393,818 B2
(45) Date of Patent: Aug. 27, 2019

(54) SYSTEMS AND METHODS FOR CHARACTERIZING IMPEDANCE OF AN ENERGY STORAGE DEVICE

(71) Applicant: The Trustees of Dartmouth College, Hanover, NH (US)

(72) Inventors: Eric Din, Seattle, WA (US); Christopher Schaef, Beaverton, OR (US); Keith Moffat, Berkeley, CA (US); Jason T. Stauth, Hanover, NH (US)

(73) Assignee: THE TRUSTEES OF DARTMOUTH COLLEGE, Hanover, NH (US)

( * ) Notice: Subject to any disclaimer, the term of this patent is extended or adjusted under 35 U.S.C. 154(b) by 190 days.

(21) Appl. No.: 15/368,426

(22) Filed: Dec. 2, 2016

(65) Prior Publication Data
US 2017/0160348 A1   Jun. 8, 2017

Related U.S. Application Data

(60) Provisional application No. 62/263,238, filed on Dec. 4, 2015.

(51) Int. Cl.
    H02J 7/00      (2006.01)
    H02M 1/00      (2006.01)
    G01R 31/389    (2019.01)

(52) U.S. Cl.
    CPC .......... *G01R 31/389* (2019.01); *H02J 7/0014* (2013.01); *H02J 7/0016* (2013.01);
    (Continued)

(58) Field of Classification Search
    CPC ............ G01R 31/3606; G01R 31/3662; H02J 7/0014; H02J 7/0016; H02J 7/0018;
    (Continued)

(56) References Cited

U.S. PATENT DOCUMENTS 8,212,399 B2 *  7/2012 Besser .................. H02J 7/0068
                                                     307/18
9,786,937 B2 * 10/2017 Choi .................... H01M 8/0494
(Continued)

OTHER PUBLICATIONS

Buller et al. (2005) "Impedance-Based Simulation Models of Supercapacitors and Li-Ion Batteries for Power Electronic Applications," IEEE Transactions on Industry Applications. 41:742-747.
(Continued)

*Primary Examiner* — Levi Gannon
(74) *Attorney, Agent, or Firm* — Lathrop Gage LLP

(57) ABSTRACT

A method for characterizing electrical impedance of an energy storage device includes the following steps: (a) controlling a first switching power converter to transfer electric power between a first energy storage device and a load, (b) controlling the first switching power converter to generate a sinusoidal perturbation on electric current flowing through the first energy storage device, (c) determining an alternating current (AC) component of the electric current flowing through the first energy storage device, (d) determining an AC component of voltage across the first energy storage device, and (e) determining a complex impedance of the first energy storage device based at least in part on the AC component of the electric current flowing through the first energy storage device and the AC component of the voltage across the first energy storage device.

18 Claims, 10 Drawing Sheets

(52) U.S. Cl.
CPC ............... *H02M 2001/007* (2013.01); *H02M 2001/0009* (2013.01)

(58) Field of Classification Search
CPC .. H02M 1/08; H02M 1/088; H02M 2001/007; H02M 2001/0009; H02M 3/07; H02M 3/10; H02M 3/135; H02M 3/137; H02M 3/139; H02M 3/142; H02M 3/145; H02M 3/155–158; H02M 3/1582; H02M 3/1584
See application file for complete search history.

(56) References Cited

U.S. PATENT DOCUMENTS

| | | | | |
|---|---|---|---|---|
| 2007/0090801 A1* | 4/2007 | Kim | ............... | G01R 31/362 320/128 |
| 2012/0099618 A1* | 4/2012 | Nishi | ............... | G01K 7/42 374/152 |
| 2014/0070820 A1* | 3/2014 | Depernet | ............... | G01R 31/3662 324/650 |
| 2014/0125284 A1* | 5/2014 | Qahouq | ............... | H02J 7/0065 320/118 |
| 2015/0198675 A1* | 7/2015 | Hebiguchi | ............... | G01R 31/3662 324/430 |
| 2015/0214757 A1* | 7/2015 | Zane | ............... | H02J 7/0021 320/107 |
| 2016/0103186 A1* | 4/2016 | Hong | ............... | G01R 31/36 324/430 |
| 2016/0202326 A1* | 7/2016 | Sakai | ............... | G01R 31/3662 324/430 |
| 2017/0163160 A1 | 6/2017 | Din et al. | | |

OTHER PUBLICATIONS

Cao et al. (2008) "Battery balancing methods: A comprehensive review," In; The Proceedings of the Vehicle Power and Propulsion Conference, 2008. VPPC '08. IEEE. pp. 1-6.
Din et al. (Jul. 2015) "Online spectroscopic diagnostics implemented in an efficient battery management system," In; The Proceedings of the IEEE 16th Workshop on Control and Modeling for Power Electronics (COMPEL), 2015, 7 pgs.
Einhorn et al. (2011) "Improved performance of serially connected Li-ion batteries with active cell balancing in electric vehicles," IEEE Transactions on Vehicular Technology. 60:2448-2457.
Howey et al. (Dec. 3, 2013) "Online measurement of battery impedance using motor controller excitation," IEEE Transactions on Vehicular Technology. 63:2557-2566.
Kimball et al. (2007) "Increased performance of battery packs by active equalization," In; The Proceedings of the Vehicle Power and Propulsion Conference, 2007. VPPC 2007. IEEE. pp. 323-327.
Koch et al. (Aug. 2014) "Electrochemical impedance spectroscopy for online battery monitoring—power electronics control," In; The Proceedings of the 16th European Conference on Power Electronics and Applications (EPE'14-ECCE Europe), 2014. pp. 1-10.
Kutkut et al. (1996) "Dynamic equalizatioD techniques for series battery stacks," In; The Proceedings of the 18th International Telecommunications Energy Conference, 1996. INTELEC '96. pp. 514-521.
Lee et al. (2011) "Comparison of passive cell balancing and active cell balancing for automotive batteries," In; The Proceedings of the Vehicle Power and Propulsion Conference (VPPC), 2011 IEEE. pp. 1-7.
Li et al. (Jul. 15, 2014) "An electrochemistry-based impedance model for lithium-ion batteries," Journal of Power Sources. 258:9-18.
Moore et al. (2001) "A Review of Cell Equalization Methods for Lithium Ion and Lithium Polymer Battery Systems," in SAE Technical Paper 2001-01-0959. SAE 2001 World Congress, 5 pgs.
Olalla et al. (Sep. 14, 2012) "Architectures and Control of Submodule Integrated DC-DC Converters for Photovoltaic Applications," IEEE Transactions on Power Electronics. 28(6):2980-2997.
Pascual et al. "Switched capacitor system for automatic series battery equalization," In; The Proceedings of the Twelfth Annual Applied Power Electronics Conference and Exposition, 1997. APEC '97 Conference Proceedings 1997. 2:848-854.
Schaef et al. (Jun. 24, 2014) "Multilevel Power Point Tracking for Partial Power Processing Photovoltaic Converters," IEEE Journal of Emerging and Selected Topics in Power Electronics. 2(4):859-869.
Shimizu et al. (2001) "Generation control circuit for photovoltaic modules," IEEE Transactions on Power Electronics. 16(3):293-300.
Stauth et al. (2012) "A Resonant Switched-Capacitor IC and Embedded System for Sub-Module Photovoltaic Power Management," IEEE Journal of Solid-State Circuits. 47(12):3043-3054.
Tröltzsch et al. (2006) "Characterizing aging effects of lithium ion batteries by impedance spectroscopy," Electrochimica Acta. 51(8-9):1664-1672.

* cited by examiner

SYSTEMS AND METHODS FOR CHARACTERIZING IMPEDANCE OF AN ENERGY STORAGE DEVICE

RELATED APPLICATIONS

This application claims the benefit of priority to U.S. Provisional Patent Application Ser. No. 62/263,238 filed Dec. 4, 2015, which is incorporated herein by reference.

GOVERNMENT RIGHTS

This invention was made with government support under Grants ECCS-1407725 and 1542984 awarded by the National Science Foundation. The government has certain rights in the invention.

BACKGROUND

Electrochemical impedance spectroscopy (EIS) is a method of extracting complex impedance of a system by measuring a response of the system to a sinusoidal electrical perturbation. EIS is used, for example, to measure corrosion, to evaluate coatings, and to characterize electrochemical systems, such as batteries. Conventional EIS systems generate a sinusoidal electrical perturbation using electronic circuitry, such as amplifier circuitry, operating in its linear region. Linear region operation typically results in significant power loss at high current magnitudes. Therefore, conventional EIS systems are generally limited to use with high impedance systems.

SUMMARY

In an embodiment, a method for characterizing electrical impedance of an energy storage device includes the following steps: (a) controlling a first switching power converter to transfer electric power between a first energy storage device and a load, (b) controlling the first switching power converter to generate a sinusoidal perturbation on electric current flowing through the first energy storage device, (c) determining an alternating current (AC) component of the electric current flowing through the first energy storage device, (d) determining an AC component of voltage across the first energy storage device, and (e) determining a complex impedance of the first energy storage device based at least in part on the AC component of the electric current flowing through the first energy storage device and the AC component of the voltage across the first energy storage device.

In an embodiment, a system for characterizing electrical impedance of an energy storage device includes a control subsystem and a first switching power converter for electrically coupling to a first energy storage device. The control subsystem includes a power conversion control module, a perturbation control module, a current sensing module, a voltage sensing module, and an impedance determining module. The power conversion control module is configured to control the first switching power converter to transfer electric power between the first energy storage device and a load electrically coupled to the first switching power converter. The perturbation control module is configured to control the first switching power converter to generate a sinusoidal perturbation on electric current flowing through the first energy storage device. The current sensing module is configured to determine an alternating current (AC) component of the electric current flowing through the first energy storage device, and the voltage sensing module is configured to determine an AC component of voltage across the first energy storage device. The impedance determining module is configured to determine a complex impedance of the first energy storage device based at least in part on the AC component of the electric current flowing through the first energy storage device and the AC component of the voltage across the first energy storage device.

DETAILED DESCRIPTION OF THE EMBODIMENTS

Applicant has developed power electronics-based EIS systems which include one or more switching power converters. Each switching power converter performs at least two different roles, i.e. it generates sinusoidal electric perturbations for EIS as well as controls power transfer between one or more electric power sources and other circuitry, such as a load. In this document, the term "electric power source" includes energy storage devices, such as batteries and capacitors, as well as electric power sources not associated with energy storage, such as a photovoltaic device, a generator, or an electric power grid. In certain embodiments, each switching power converter is capable of driving a large load, thereby allowing the EIS system to be used with low-impedance electric power sources, such as electric power sources including a plurality of parallel-coupled battery cells. Additionally, in some embodiments, the EIS system is capable of simultaneously performing EIS and power conversion, such that EIS is performed in "real-time." In certain embodiments, each electric power source includes a battery or other energy storage device, and the EIS system is configured to perform EIS while performing battery management functions. Embodiments of the present power electronics-based EIS systems where the electric power source includes an energy storage device can be referred to systems for characterizing electrical impedance of an energy storage device.

Figure 1:
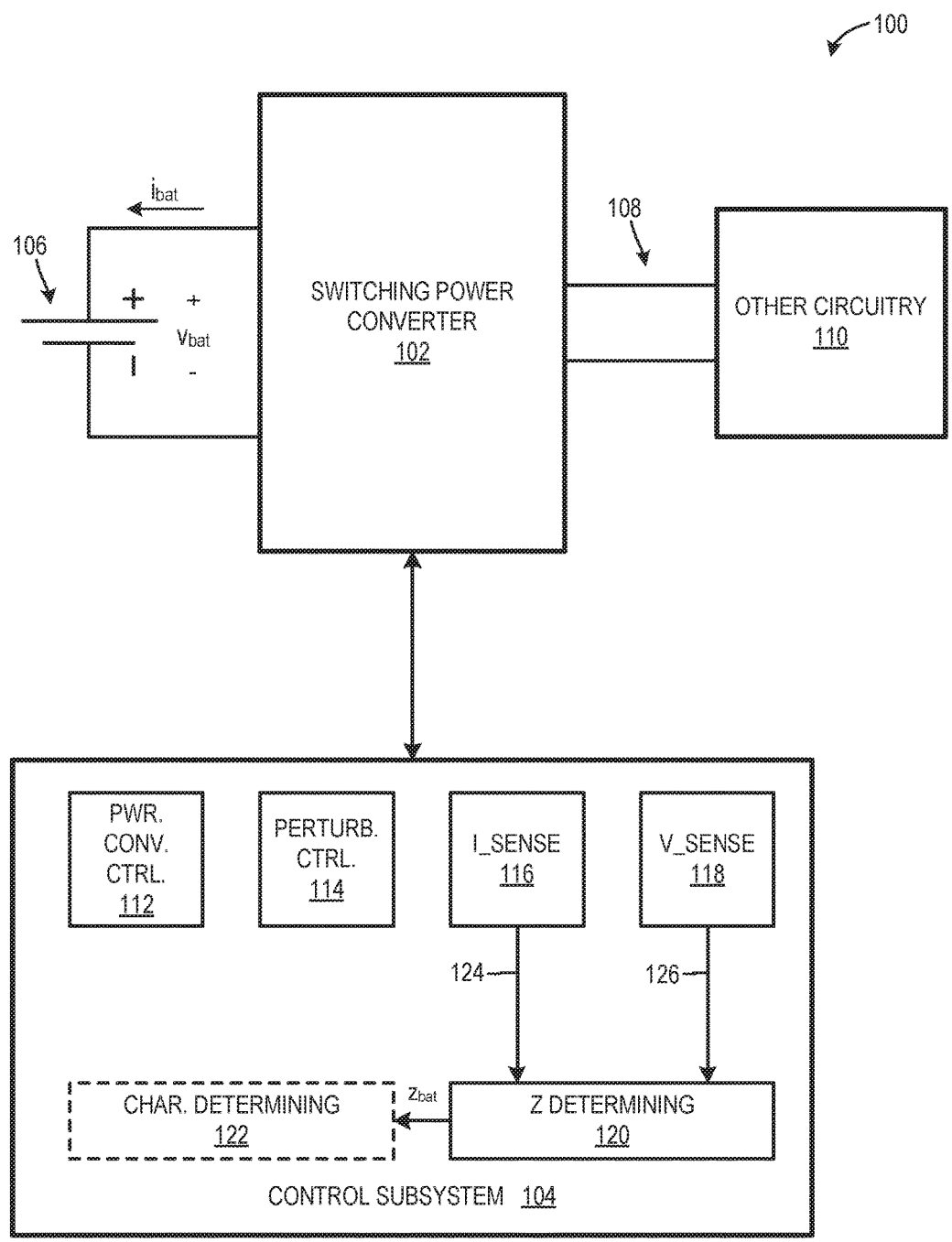
FIG. 1 illustrates a system for characterizing electrical impedance of an energy storage device, according to an embodiment.

FIG. 1 illustrates a system 100 for characterizing electrical impedance of an energy storage device. System 100 includes a switching power converter 102 and a control subsystem 104. Switching power converter 102 is electrically coupled between a battery 106 and an electric power bus 108. Electric power bus 108 is electrically coupled to other circuitry 110 which includes, for example, a load (not shown) and/or one or more additional electric power sources (not shown). Battery 106 could be replaced by or supplemented with another type of energy storage device, such as a capacitor. Additionally, battery 106 could be replaced with an electric power source not associated with energy storage, such as a photovoltaic device, a generator, or an electric power grid, without departing from the scope hereof. Although FIG. 1 illustrates system 100 as including battery 106, electric power bus 108, and other circuitry 110, one or more of these elements may be separate from system 100 without departing from the scope hereof.

Switching power converter 102 may have either an isolated topology or a non-isolated topology. In this document, a "switching power converter" is a device which transfers power by causing at least one switching device to repeatedly switch between its conductive and non-conductive states to charge and/or discharge an energy storage device, such as an inductor or a capacitor. The term "switching device" in this document refers to a device capable of being repeatedly switched between its conductive and non-conductive states, such as a bipolar junction transistor (BJT), a field effect transistor (FET), or an insulated gate bipolar junction transistor (IGBT). In some embodiments, switching power converter 102 is a buck-type converter, a boost-type converter, a buck-boost-type converter, a flyback-type converter, a forward-type converter, a half bridge-type converter, a full bridge-type converter, a Ca-type converter, a switched-capacitor-type converter, or a resonant switched-capacitor-type converter.

Control subsystem 104 includes a power conversion control module 112, a perturbation control module 114, a current sensing module 116, a voltage sensing module 118, an impedance determining module 120, and an optional characteristic determining module 122. Modules 112, 114, 116, 118, 120, and 122 are implemented by hardware, instructions in the form of software or firmware executed by a computing device, or a combination thereof. For example, in certain embodiments, control subsystem 104 includes a processor (not shown) communicatively coupled to a memory (not shown), and the processor executes instructions stored in the memory in the form of software or firmware to perform one or more functions of control subsystem 104.

Although modules 112, 114, 116, 118, 120, and 122 are illustrated as discrete elements, one or more of these modules may be combined without departing from the scope hereof. Additionally, control subsystem 104 is optionally distributed between two or more physical devices, and some or all of control subsystem 104 may be included within switching power converter 102. For example, in a particular embodiment, current sensing module 116 and voltage sensing module 118 are included within switching power converter 102, while power conversion control module 112, perturbation control module 114, impedance determining module 120, and characteristic determining module 122 are physically separate from switching power converter 102.

Power conversion control module 112 controls switching power converter 102 to transfer electric power between battery 106 and other circuitry 110, such as to control charging and discharging of battery 106, or to balance energy stored within battery 106 with that stored in other batteries (not shown) electrically coupled to electric power bus 108. For example, in some embodiments, power conversion control module 112 controls a duty cycle of at least one switching device in switching power converter 102 to transfer electric power between battery 106 and other circuitry 110, such as using a pulse width modulation (PWM) or pulse frequency modulation (PFM) technique.

Perturbation control module 114 controls switching power converter 102 to generate sinusoidal perturbations at a plurality of frequencies on current $i_{bat}$ flowing through battery 106. For example, in some embodiments, perturbation control module 114 controls a duty cycle of at least one switching device in switching power converter 102 to generate sinusoidal perturbations at a plurality of frequencies on current $i_{bat}$, such as by varying the duty cycle according to magnitude of one or more reference sinusoidal signals representing the desired sinusoidal perturbations.

Figure 7:
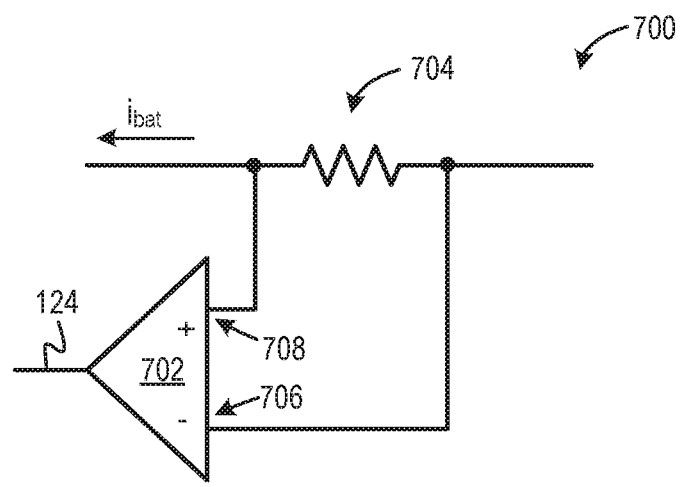
FIG. 7 illustrates a current sensing circuit, according to an embodiment.

Current sensing module 116 generates a signal 124 representing magnitude and phase of current $i_{bat}$. In some embodiments, current sensing module 116 includes filter circuitry so that signal 124 is at least substantially devoid of low-frequency components and high-frequency noise. FIG. 7 illustrates a current sensing circuit 700, which is one possible embodiment of current sensing module 116. Current sensing circuit 700 includes an amplifier 702 and a sense resistor 704. Sense resistor 704 is electrically coupled in series with battery 106 so that current $i_{bat}$ generates a voltage across sense resistor 704 that is proportional to magnitude of current $i_{bat}$. Sense resistor 704 optionally has a low resistance, such as less than one ohm, to promote low power dissipation in sense resistor 704. Inverting input 706 and non-inverting input 708 of amplifier 702 are electrically coupled to opposing respective ends of sense resistor 704, and amplifier 702 generates signal 124 having magnitude $A*R*i_{bat}$, where A is gain of amplifier 702 and R is resistance of sense resistor 704. Inverting input 706 and non-inverting input 708 could be swapped without departing from the scope hereof. Current sensing circuit 700 optionally includes further components (not shown) to filter signal 124 to remove low-frequency components and high-frequency noise.

Figure 8:
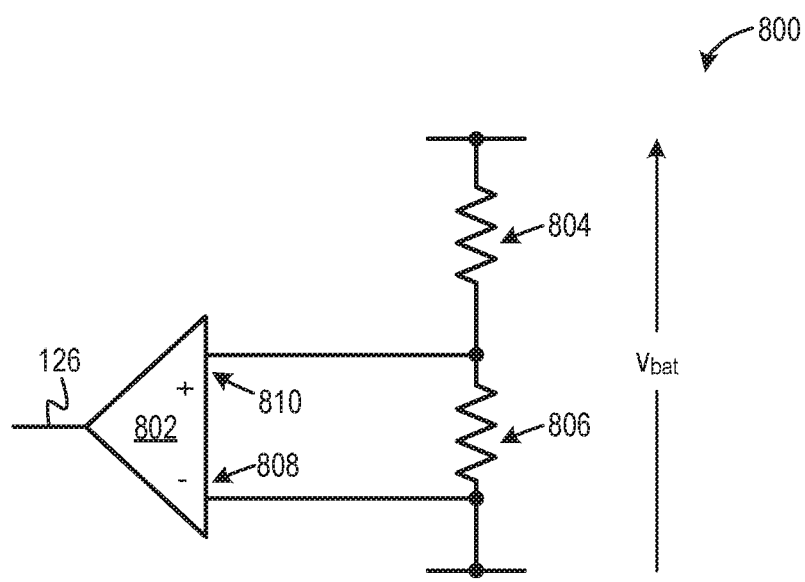
FIG. 8 illustrates a voltage sensing circuit, according to an embodiment.

Voltage sensing module 118 generates a signal 126 representing magnitude and phase of a voltage $v_{bat}$ across battery 106. In some embodiments, voltage sensing module 118 includes filter circuitry so that signal 126 is at least substantially devoid of low-frequency components and high-frequency noise. FIG. 8 illustrates a voltage sensing circuit 800, which is one possible embodiment of voltage sensing module 118. Voltage sensing circuit 800 includes an amplifier 802, a first resistor 804, and a second resistor 806. Resistors 804 and 806 are electrically in series across battery 106, such that voltage $v_{bat}$ is applied across the series combination of resistors 804 and 806. Resistors 804 and 806 collectively divide down magnitude of voltage $v_{bat}$ to a value that is compatible with amplifier 802. Inverting input 808 and non-inverting input 810 of amplifier 802 are electrically coupled to opposing respective ends of second resistor 806, and amplifier 802 generates signal 126 having magnitude $v_{bat}*A*R806/(R804+R806)$, where A is gain of amplifier 802, R804 is resistance of first resistor 804, and R806 is resistance of second resistor 806. Voltage sensing circuit 800 optionally includes further components (not shown) to filter signal 126 to remove low-frequency components and high-frequency noise.

Impedance determining module 120 determines complex impedance $z_{bat}$ of battery 106 from signals 124 and 126 at each frequency of the sinusoidal perturbations on current $i_{bat}$, such as by dividing signal 126 by signal 124 using analog circuitry, digital circuitry, or a combination of analog and digital circuitry. Characteristic determining module 122 determines one or more characteristics of battery 106, such as state-of-charge (SOC) of battery 106, state-of-health (SOH) of battery 106, and/or solid electrolyte interface (SEI) layer formation of battery 106, at least partially based on complex impedance $z_{bat}$, using techniques known in the art, such as by comparing $z_{bat}$ to complex impedance values in a look-up table correlating complex impedance to battery characteristics.

Figure 2:
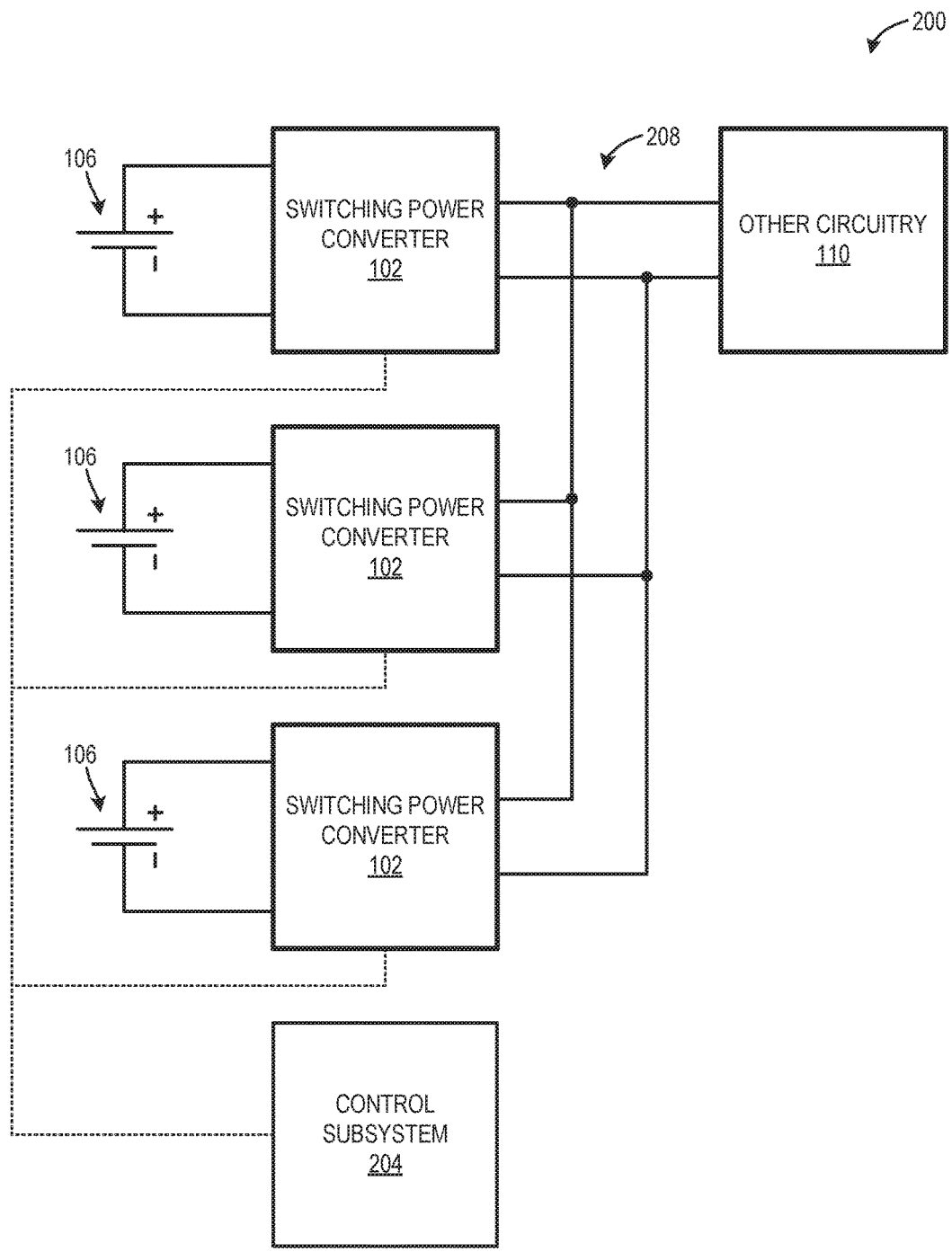
FIG. 2 illustrates a system for characterizing electrical impedance of an energy storage device similar to that of FIG. 1 but including a plurality of switching power converters, according to an embodiment.

The power electronics-based EIS systems disclosed herein can include a plurality of switching power converters for interfacing with a plurality of electric power sources. For example, FIG. 2 illustrates a system 200 for characterizing electrical impedance of an energy storage device like system 100 of FIG. 1, but including a plurality of switching power converters 102 electrically coupled to respective batteries 106. Outputs of switching power converters 102 are electrically coupled in parallel to other circuitry 110 via an electric power bus 208. System 200 additionally includes a control subsystem 204 in place of control subsystem 104. Control subsystem 204 is capable of performing the functions described above with respect to control subsystem 104 on multiple instances of switching power converter 102. Although FIG. 2 illustrates system 200 as including batteries 106, electric power bus 208, and other circuitry 110, one or more of these elements may be separate from system 200 without departing from the scope hereof. Furthermore, in some alternate embodiments of system 200, batteries 106 are electrically coupled in series and/or parallel.

Figure 3:
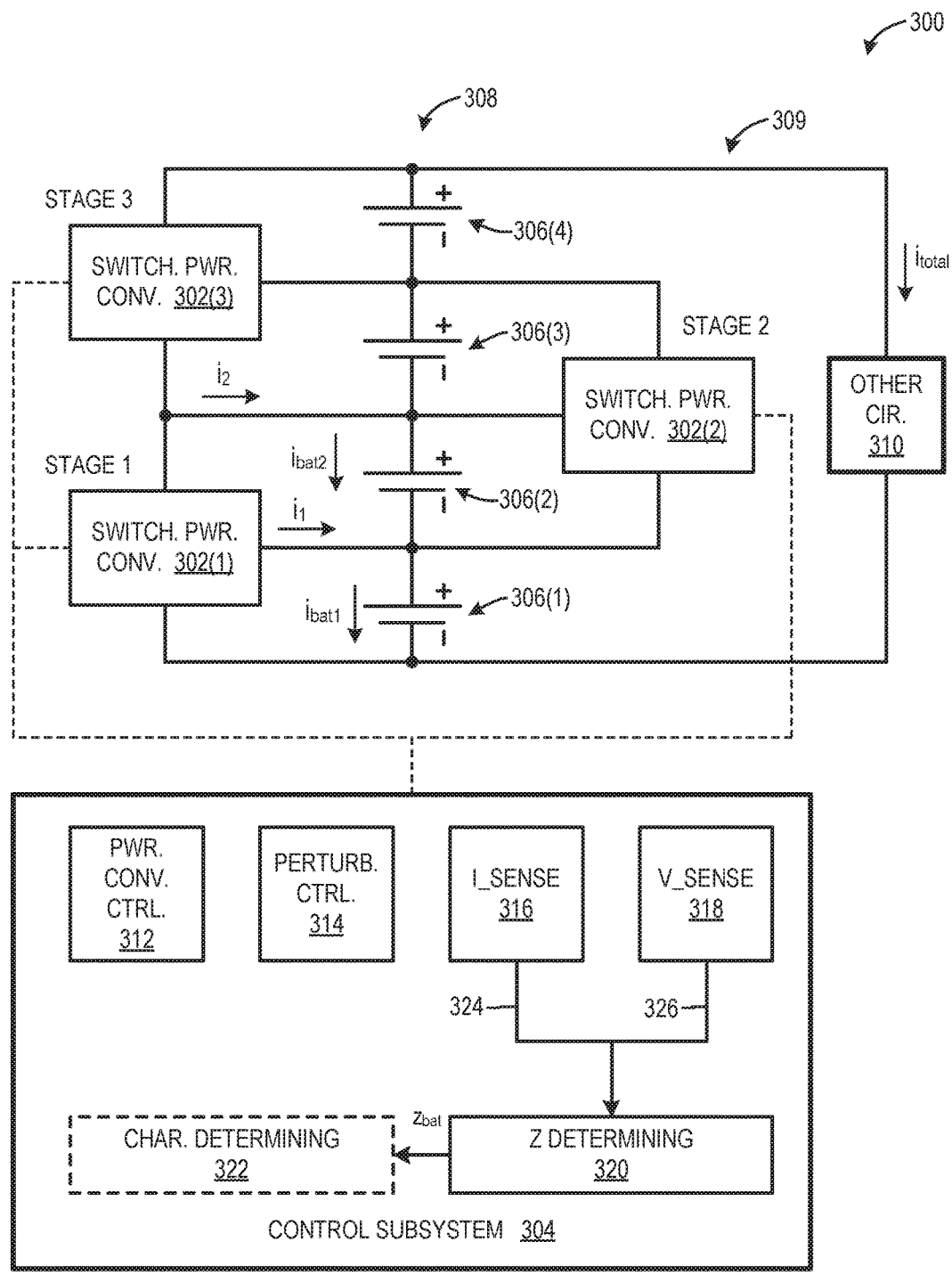
FIG. 3 illustrates a system for characterizing electrical impedance of an energy storage device including a plurality of switching power converters configured as a ladder converter, according to an embodiment.

FIG. 3 illustrates another power electronics-based EIS system for use with a plurality of electric power sources. In particular, FIG. 3 illustrates a system 300 for characterizing electrical impedance of an energy storage device including a plurality of switching power converters 302 and a control subsystem 304. In this document, specific instances of an item may be referred to by use of a numeral in parentheses (e.g., switching power converter 302(1)) while numerals without parentheses refer to any such item (e.g., switching power converters 302). Switching power converters 302 are electrically coupled to batteries 306, and batteries 306 are electrically coupled in series to form a string 308. String 308 is electrically coupled via an electric power bus 309 to other circuitry 310 which includes, for example a load and/or additional electric power sources. The number of batteries 306 in string 308 can vary, and batteries 306 can be supplemented with or replaced by another type of energy storage device, such as capacitors. Additionally, batteries 306 could be replaced with electric power sources not associated with energy storage, such as a generators or photovoltaic devices, without departing from the scope hereof. Additionally, although FIG. 3 illustrates system 300 as including batteries 306, string 308, electric power bus 309, and other circuitry 310, one or more of these elements may be separate from system 300 without departing from the scope hereof.

Switching power converters 302 are configured to form a ladder converter including one less switching power converter 302 than the number of batteries 306 in string 308. The ladder converter includes one stage for each switching power converter 302, as indicated in FIG. 3. Each switching power converter 302 is electrically coupled across two respective instances of battery 306. As discussed below, each switching power converter 302 is configured to transfer energy between its two respective batteries 306, so that switching power converters 302 are collectively capable of shuffling energy up and down string 308 as needed to balance energy stored in batteries 306.

Control subsystem 304 includes a power conversion control module 312, a perturbation control module 314, a current sensing module 316, a voltage sensing module 318, an impedance determining module 320, and an optional characteristic determining module 322. Modules 312, 314, 316, 318, 320, and 322 perform functions similar to those of modules 112, 114, 116, 118, 120, and 122 of FIG. 1. In some embodiments, control subsystem 304 is implemented in a manner similar to control subsystem 104 of FIG. 1.

Figure 4:
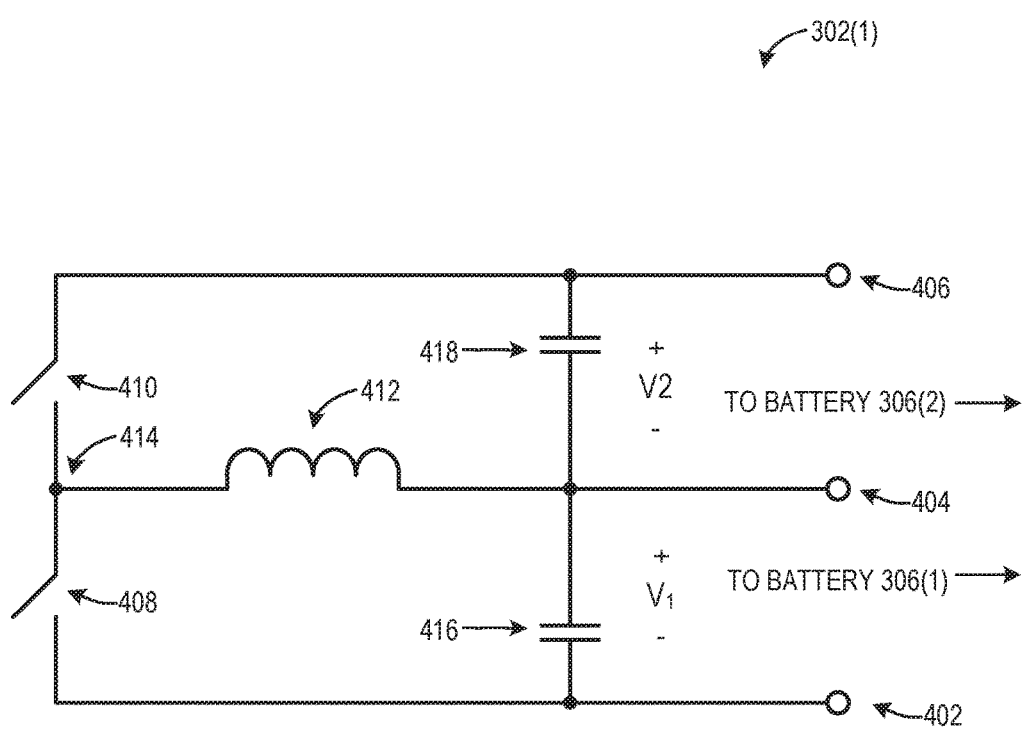
FIG. 4 illustrates one possible implementation of a switching power converter of the system of FIG. 3, according to an embodiment.

FIG. 4 illustrates details of switching power converter 302(1). Other instances of switching power converters 302 are implemented in a like manner. Switching power converter 302(1) includes a first terminal 402, a second terminal 404, a third terminal 406, a first switching device 408, a second switching device 410, an inductor 412, a first capacitor 416, and a second capacitor 418. First switching device 408 is electrically coupled between first terminal 402 and switching node 414, and second switching device 410 is electrically coupled between switching node 414 and third terminal 406. Inductor 412 is electrically coupled between switching node 414 and second terminal 404. First capacitor 416 is electrically coupled between first terminal 402 and second terminal 404, and second capacitor 418 is electrically coupled between second terminal 404 and third terminal 406. First and second terminals 402 and 404 are electrically coupled across battery 306(1), and second and third terminals 404 and 406 are electrically coupled across immediately adjacent battery 306(2).

A ratio of voltage $V_2$ across battery 306(2) to voltage $V_1$ across battery 306(1) is equal to $D_1/(1-D_1)$, where $D_1$ is a duty cycle of first switching device 408, which is the portion of each switching cycle of switching power converter 302(1) where first switching device 408 is operating in its conductive state. Consequentially, energy can be transferred between batteries 306(1) and 306(2) by adjusting $D_1$, since changing the ratio of $V_2$ to $V_1$ will cause energy to be transferred between battery cells 306(1) and 306(2). The direction of energy transfer is determined by the polarity of change in $D_1$, and the amount of energy transferred is a positive function of the magnitude of change in $D_1$. However, the ratio $V_2/V_1$ may be difficult to instrument and use as a control parameter because the ratio is nonlinear and is computational intensive to determine. Therefore, in some embodiments, each switching power converter 302 is at least partially controlled by control subsystem 304 according to $\Delta v$, which is difference between voltages of its two respective batteries, e.g. the difference $V_1$ and $V_2$ in switching power converter 302(1). When one of first and second switching devices 408 and 410 changes from its conductive state to its non-conductive state, the other switching device 408 or 410 operates in its non-conductive state, to provide a path for current flowing through inductor 412.

Power conversion control module 312 controls $\Delta v$ of each switching power converter 302 as needed to at least substantially equalize energy stored in batteries 306 by transferring energy between adjacent batteries 306 in the string 308. For example, assume that battery 306(1) is storing excessive energy, battery 306(2) is storing a desired amount of energy, and battery 306(3) is storing insufficient energy. Power conversion control module 312 causes transfer of energy from battery 306(1) to battery 306(3) by adjusting Δv to switching power converter 302(1) so that $D_1$ of switching power converter 302(1) changes and causes switching power converter 302(1) to transfer energy from battery 306(1) to battery 306(2), and then by adjusting Δv to switching power converter 302(2) so that $D_1$ of switching power converter 302(2) changes and causes switching power converter 302(2) to transfer energy from battery 306(2) to battery 306(3).

Perturbation control module 314 controls duty cycle of switching devices 408 and 410 of each switching power converter 302 to generate sinusoidal perturbations at a plurality of frequencies on current flowing through it respective batteries 306. For example, perturbation control module 314 controls switching power converter 302(1) to generate sinusoidal perturbations on current flowing through each of batteries 306(1) and 306(2), and perturbation control module 314 causes switching power converter 302(2) to generate sinusoidal perturbations on current flowing through each of batteries 306(2) and 306(3). In some embodiments, perturbation control module 314 causes only one switching power converter 302 to generate sinusoidal perturbations at a given time, to facilitate determining current through batteries 306, as discussed below.

Current sensing module 316 generates one or more signals 324 representing magnitude and phase of current flowing through each battery 306, and voltage sensing module 318 generates one or more signals 326 representing magnitude and phase of voltage across each battery 306. In some embodiments, current sensing module 316 and voltage sensing module 318 each include one or more high-pass filters so that signals 324 and 326 are at least substantially devoid of low-frequency components. In some embodiments, current sensing module 316 includes a respective instance of current sensing circuit 700 (FIG. 7) for each battery 306. Impedance determining module 320 determines complex impedance $z_{bat}$ of each battery 306 from signals 324 and 326 at each frequency of the sinusoidal perturbations on current through the battery, such as by dividing signals 326 by signals 324. Characteristic determining module 322 determines one or more characteristics of each battery 306, such as state-of-charge (SOC) of the battery, state-of-health (SOH) of the battery, and/or solid electrolyte interface (SEI) layer formation of the battery, at least partially based on complex impedance $z_{bat}$, using techniques known in the art.

Figure 5:
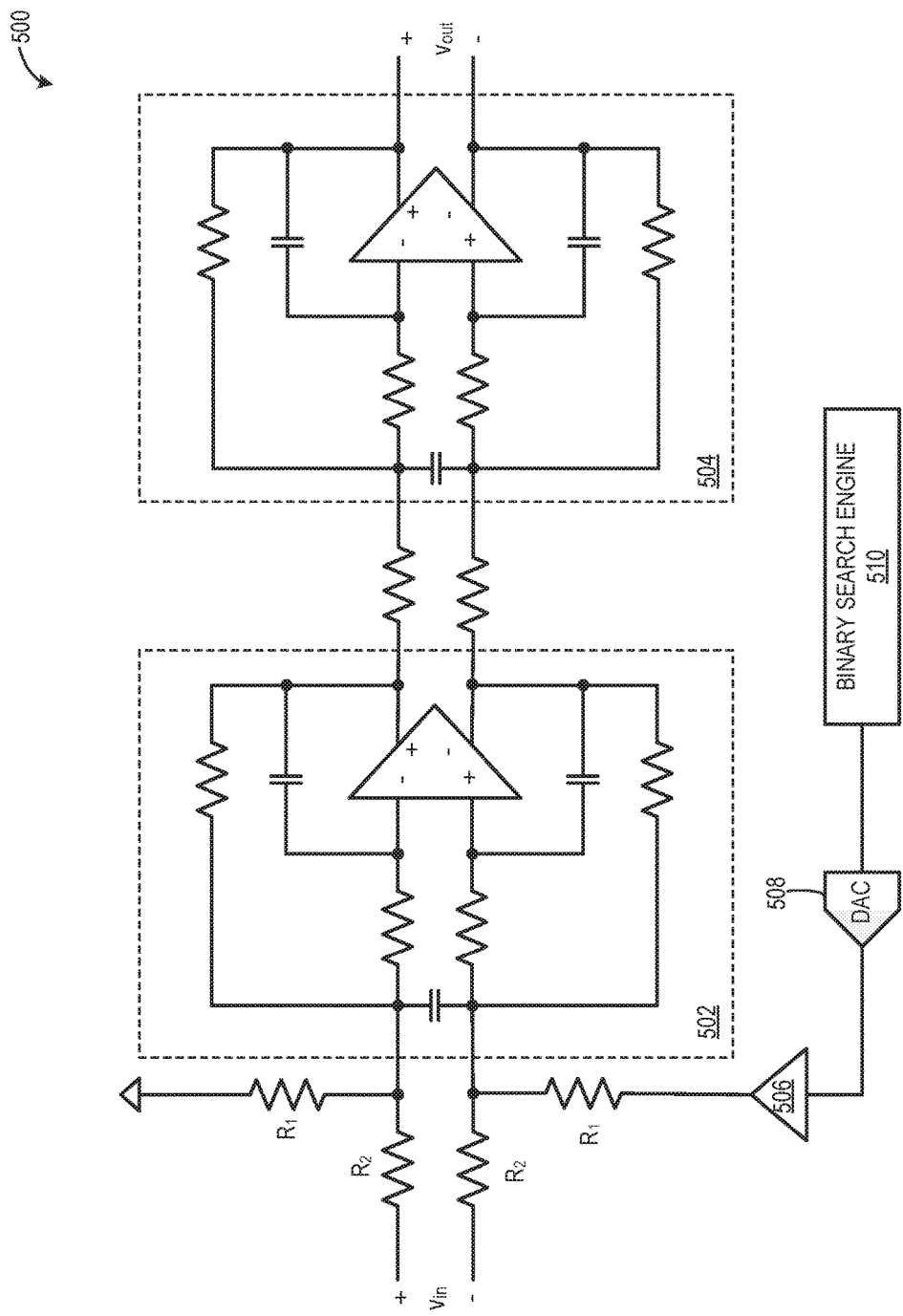
FIG. 5 illustrates a voltage sensing subsystem, according to an embodiment.

FIG. 5 illustrates a voltage sensing subsystem 500 for sensing voltage across an instance of battery 306. Some embodiments of voltage sensing module 318 include a respective instance of voltage sensing subsystem 500 for each battery 306. Voltage sensing subsystem 500 generates a differential output voltage $v_{out}$ representing voltage $v_{in}$ across battery 306, but at least substantially free of the direct current (DC) component of voltage across battery 306.

Voltage sensing subsystem 500 includes a first filter 502, a second filter 504, resistors $R_1$ and $R_2$, a gain stage 506, a digital-to-analog converter (DAC) 508, and a binary search engine 510. Resistors $R_1$ and $R_2$ divide down voltage $v_{in}$ at the input of first filter 502, to accommodate situations where voltage $v_{in}$ may be above the supply voltage of first and second filters 502 and 504. Binary search engine 510 adjusts an output voltage of DAC 508 so that the DC component of voltage $v_{out}$ is essentially zero. For example, in embodiments where gain stage 506 has a gain equal to $R_1/R_2$, binary search engine 510 adjusts an output voltage of DAC 508 to match the DC component of voltage $v_{in}$ so that the DC component of voltage $v_{out}$ is essentially zero. Each of first filter 502 and second filter 504, for example, implements a second order Butterworth low pass filter.

In some embodiments, current sensing module 316 generates signals 324 without directly measuring current through each battery 306, which may be advantageous because current through batteries 306 often has a large magnitude which may impair accuracy of current sensing circuitry and cause significant losses in current sense resistors therein. In these embodiments, current sensing module 316 determines current through each battery 306 from (1) AC balancing currents flowing through switching power converters 302 and (2) AC current $i_{total}$ flowing between string 308 and other circuitry 310. For example, in some embodiments, current sensing module 316 determines AC current $i_{bat1}$ through battery 306(1) and AC current $i_{bat2}$ through battery 306(2) using the following relationships, where $i_1$ is AC balancing current flowing to battery 306(1) from switching power converter 302(1), and $i_2$ is AC balancing current flowing to battery 306(2) from switching power converter 302(1) (see FIG. 3):

$$i_{bat2}=i_2-i_{total} \qquad \text{EQN. 1}$$

$$i_{bat1}=i_2+i_1-i_{total} \qquad \text{EQN. 2}$$

Current sensing module 316 is configured to determine current through the other batteries 306 in string 308 in a similar manner, in these embodiments.

It should be noted that EQNS. 1 and 2 hold only when switching power converters 302(2) and 302(3) do not source or sink AC current from string 308. Consequentially, in embodiments determining AC battery currents from balancing currents, perturbation control module 314 causes only one switching power converter 302 to generate sinusoidal perturbations at a given time, and the remaining switching power converters 302 operate in a high impedance state at that time so that AC currents through the remaining switching converters are negligible or even essentially nonexistent. Alternately, EQNS. 1 and 2 can be modified to account for current flowing through remaining switching power converters 302. In some other embodiments, two or more switching power converters 302 generate sinusoidal perturbations at different respective frequencies at a given time, so that current sensing module 316 can distinguish sinusoidal perturbations from different instances of switching power converters 302, thereby enabling EIS to be simultaneously performed on four or more instances of batteries 306. Balancing currents and total current $i_{total}$ are determined, for example, using current sense resistors or Hall effect transducers.

Figure 9:
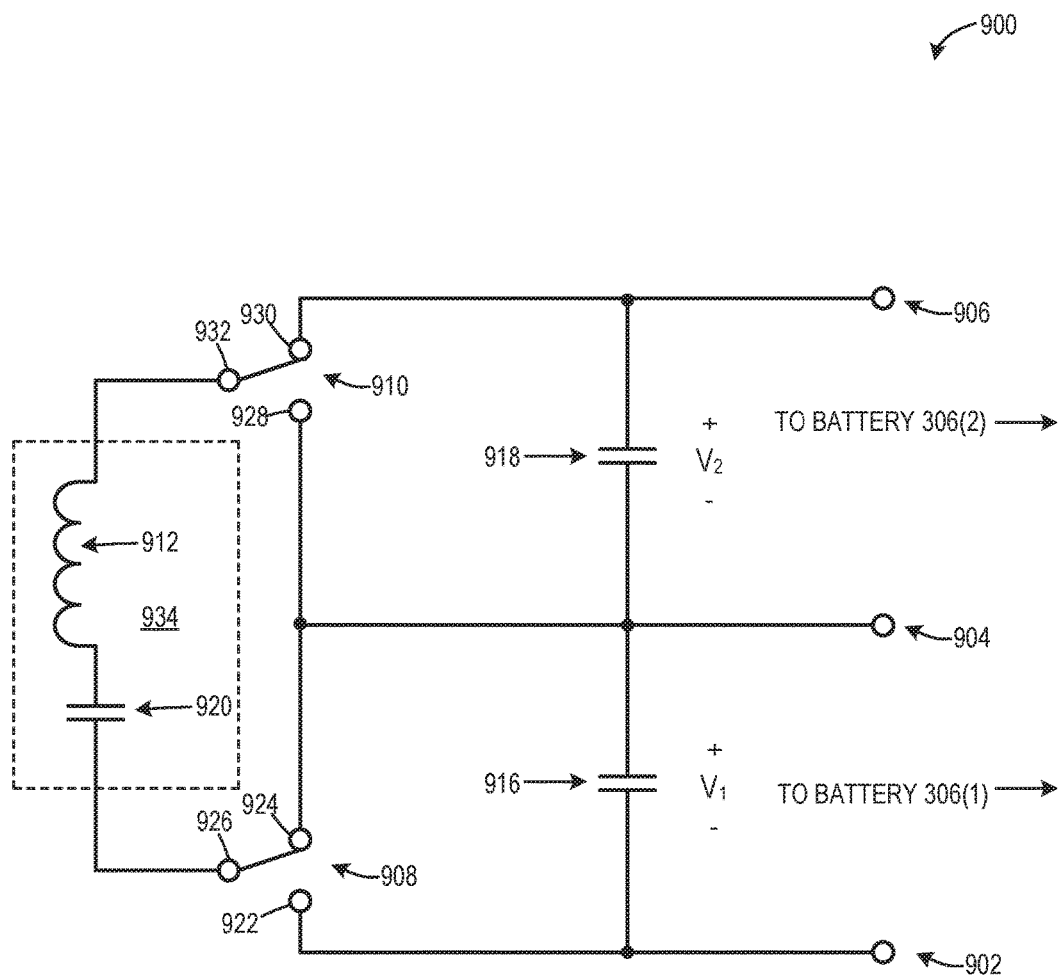
FIG. 9 illustrates an alternate embodiment of the switching power converters of the FIG. 3 system.

In an alternate embodiment of system 300, each switching power converter 302 is replaced with a respective instance of a switching power converter 900 illustrated in FIG. 9. FIG. 9 illustrates an instance of switching power converter 900 coupled across batteries 306(1) and 306(2), but other instances of switching power converter 900 are implemented in like manner in this alternate embodiment of system 300.

Switching power converter 900 has a resonant switched capacitor topology and includes a first terminal 902, a second terminal 904, a third terminal 906, a first switching device 908, a second switching device 910, an inductor 912, a first capacitor 916, a second capacitor 918, and a resonant capacitor 920. First switching device 908 is a single pole, double throw switching device including terminals 922, 924, and 926. Similarly, second switching device 910 is a single pole, double throw switching device including terminals 928, 930, and 932. Terminals 922, 924, and 926 of first switching device 908 are electrically coupled to first terminal 902, second terminal 904, and resonant capacitor 920, respectively. Terminals 928, 930, and 932 of second switching device 910 are electrically coupled to second terminal 904, third terminal 906, and inductor 912, respectively. Inductor 912 and resonant capacitor 920 are electrically coupled in series between terminal 926 of first switching device 908 and terminal 932 of second switching device 910 to form an L-C tank circuit 934. First capacitor 916 is electrically coupled between first terminal 902 and second terminal 904, and second capacitor 918 is electrically coupled between second terminal 904 and third terminal 906. First and second terminals 902 and 904 are electrically coupled across battery 306(1), and second and third terminals 904 and 906 are electrically coupled across immediately adjacent battery 306(2).

Power conversion control module 312 controls each switching power converter 900 by tuning duty cycle commands $D_1$, $D_2$, $D_3$, and $D_4$ of the switching power converter. Duty cycle command $D_1$ represents the relative time that first and second switching devices 908 and 910 electrically couple L-C tank circuit 934 in parallel with a voltage $V_1$ across battery 306(1), duty cycle command $D_2$ represents the relative time that first and second switching devices 908 and 910 electrically couple L-C tank circuit 934 in parallel with a voltage $V_2$ across battery 306(2), duty cycle command $D_3$ represents the relative time that first and second switching devices 908 and 910 electrically couple L-C tank circuit 934 across the sum of voltages $V_1$ and $V_2$, and duty cycle command $D_4$ represents the relative time that first and second switching devices 908 and 910 electrically short-circuit L-C tank circuit 934. In cases where there is no need to transfer energy between battery 306(1) and battery 306(2), power conversion control module 312 causes switching power converter 900 to operate in a resonant mode by causing $D_3$ and $D_4$ to be zero and $D_1$ and $D_2$ to be substantially equal with a switching frequency equal to a resonant switching frequency of L-C tank circuit 934, to force voltages $V_1$ and $V_2$ to be substantially equal. In cases where energy is to be transferred between battery 306(1) and battery 306(2), power conversion control module 312 causes $D_3$ and $D_4$ to be non-zero, to force a ratio of voltage $V_1$ to voltage $V_2$ to differ from unity, thereby transferring energy between batteries 306(1) and 306(2). The average value of current through inductor 912 must be zero to maintain charge balance on resonant capacitor 920. Perturbation control module 314 also controls duty cycle commands $D_1$, $D_2$, $D_3$, and $D_4$ of each switching power converter 900 to generate sinusoidal perturbations at a plurality of frequencies on current flowing through it respective battery 306, to enable impedance determining module 320 to determine complex impedance $z_{bat}$ of each battery 306 in a manner similar to that discussed above with respect to FIG. 3.

Power conversion control module 312 controls switching power converters 900 as needed to at least substantially equalize energy stored in batteries 306 by transferring energy between adjacent batteries 306 in the string 308. For example, assume that battery 306(1) is storing excessive energy and that battery 306(2) is storing insufficient energy. Power conversion control module 312 causes transfer of energy from battery 306(1) to battery 306(2) by adjusting duty cycle commands $D_3$ and $D_4$ such that the ratio of voltage $V_1$ to voltage $V_2$ is greater than one, thereby transferring energy from battery 306(1) to battery 306(2).

Figure 10:
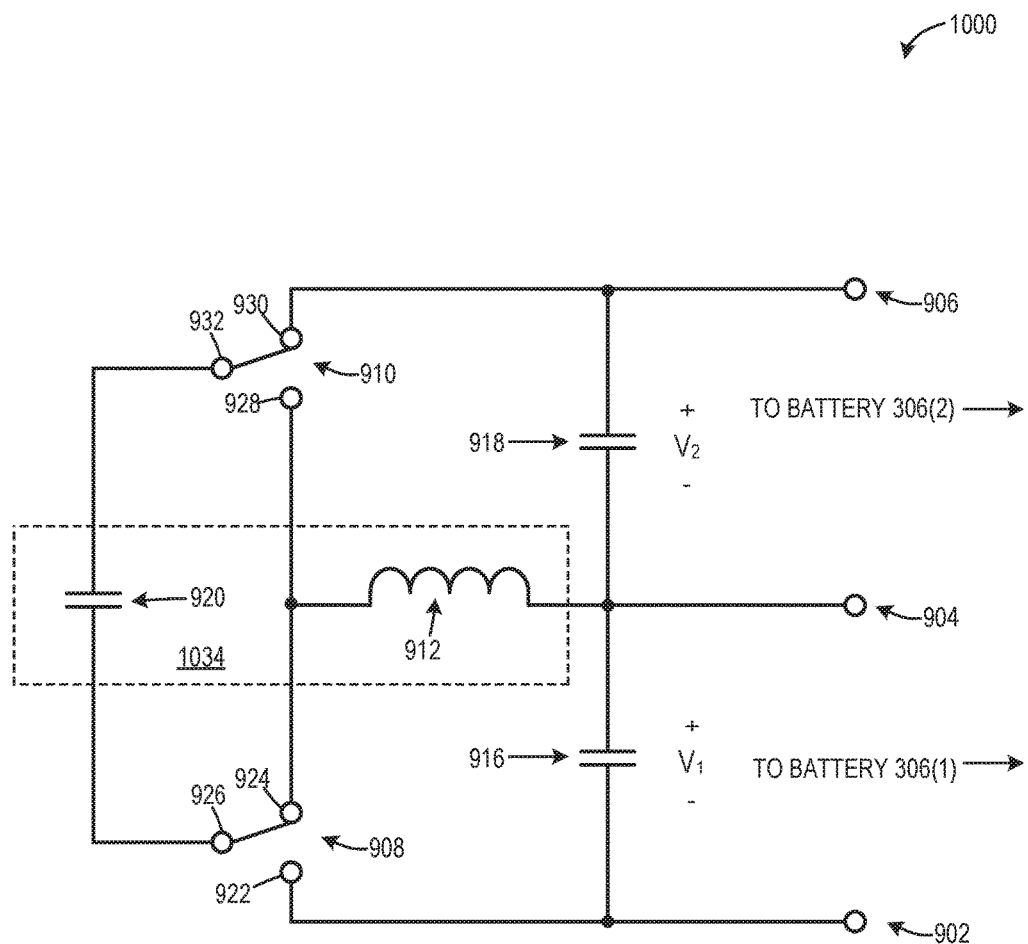
FIG. 10 illustrates another alternate embodiment of the switching power converters of the FIG. 3 system.

In another alternate embodiment of system 300, each switching power converter 302 is replaced with a respective instance of a switching power converter 1000 illustrated in FIG. 10. FIG. 10 illustrates an instance of switching power converter 1000 coupled across batteries 306(1) and 306(2), but other instances of switching power converter 1000 are implemented in like manner in this alternate embodiment of system 300.

Switching power converter 1000 is similar to switching power converter 900 of FIG. 9 but has a different tank circuit configuration. In particular, resonant capacitor 920 is electrically coupled between terminals 926 and 932 of first and second switching devices 908 and 910, respectively. Inductor 912 is electrically coupled between second terminal 904 and terminals 924 and 928 of first and second switching devices 908 and 910, respectively. Inductor 912 and resonant capacitor 920 collectively form an L-C tank circuit 1034.

Power conversion control module 312 controls switching power converter 1000 in a manner similar to that discussed above with respect to switching power converter 900 of FIG. 9. Specifically, power conversion control module 312 controls each switching power converter 1000 by tuning duty cycle commands $D_1$ and $D_2$ to achieve a desired transfer of energy between batteries. In switching power converter 1000, duty cycle command $D_1$ represents the relative time that switching devices 908, 910 electrically couple resonant capacitor 920 between third terminal 906 and inductor 912, while duty cycle command $D_2$ represents the relative time that switching devices 908, 910 electrically couple resonant capacitor 920 between inductor 912 and first terminal 902. Power conversion control module 312 causes transfer of energy between batteries 306 by varying the ratio of $D_1$ to $D_2$. In contrast to switching power converter 900 of FIG. 9, current flows through inductor 912 in only a single direction, i.e. toward second terminal 904, in switching power converter 1000.

Figure 11:
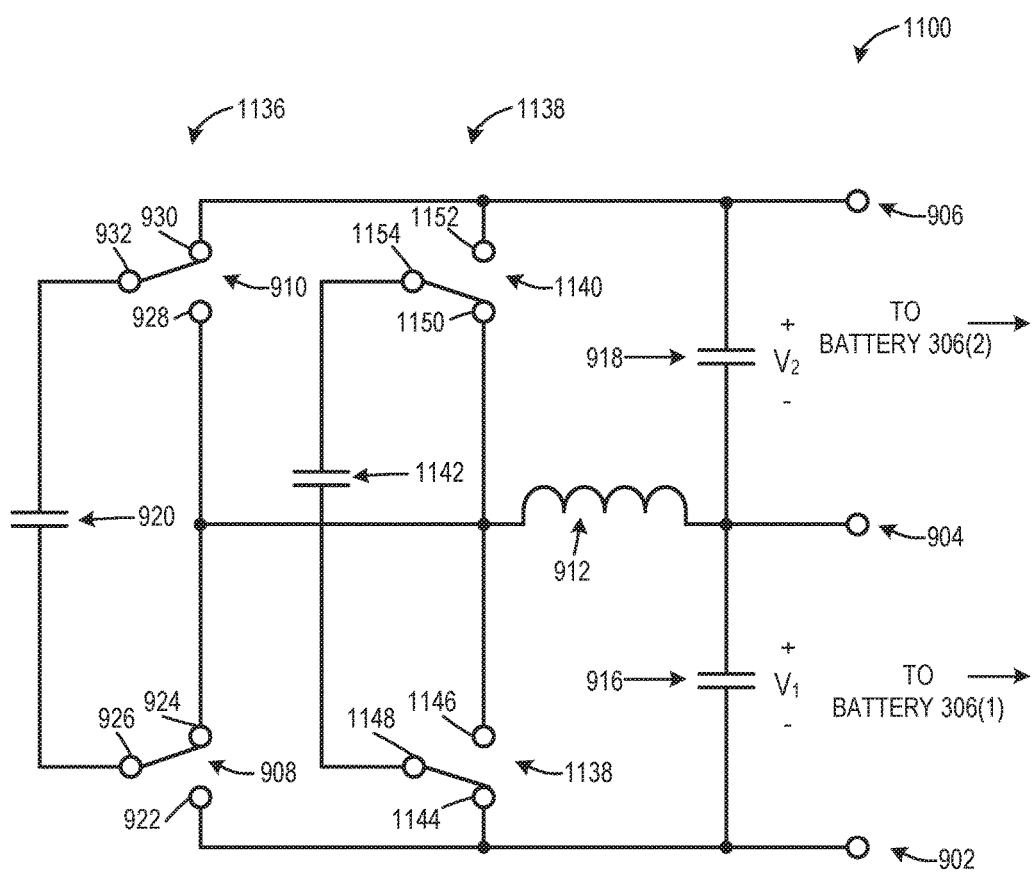
FIG. 11 illustrates yet another alternate embodiment of the switching power converters of the FIG. 3 system.

In yet another alternate embodiment of system 300, each switching power converter 302 is replaced with a respective instance of a switching power converter 1100 illustrated in FIG. 11. FIG. 11 illustrates an instance of switching power converter 1100 coupled across batteries 306(1) and 306(2), but other instances of switching power converter 1100 are implemented in like manner in this alternate embodiment of system 300.

Switching power converter 1100 is similar to switching power converter 1000 of FIG. 10 but includes two switched capacitor stages, instead of only one switched capacitor stage. In particular, switching power converter 1100 includes a first switched capacitor stage 1136 and a second switched capacitor stage 1138 electrically coupled in parallel with each other. First switched capacitor stage 1136 includes first switching device 908, second switching device 910, and resonant capacitor 920 configured as discussed above with respect to FIG. 10. Second switched capacitor stage 1138 includes a third switching device 1138, a fourth switching device 1140, and a second resonant capacitor 1142. Third switching device 1138 is a single pole, double throw switching device including terminals 1144, 1146, and 1148. Similarly, second switching device 1140 is a single pole, double throw switching device including terminals 1150, 1152, and 1154. Terminals 1144, 1146, and 1148 of third switching device 1138 are electrically coupled to terminal 902, inductor 912, and second resonant capacitor 1142, respectively. Terminals 1150, 1152, and 1154 of fourth switching device 1140 are electrically coupled to inductor 912, third terminal 906, and second resonant capacitor 1142, respectively.

Power conversion control module 312 controls each switching power converter 1100 in a manner similar to that discussed above with respect to switching power converter 1000 of FIG. 10, although power conversion control module 312 causes first and second switched capacitor stages 1136 and 1138 to switch 180 degrees out-of-phase with respect to each other, or in other words, such that first and second switched capacitor stages 1136 and 1138 switch in a complementary manner, to achieve two-phase interleaving with only a single inductor 912. Specifically, power conversion control module 312 controls each switching power converter 1100 by tuning duty cycle commands $D_1$ and $D_2$ to achieve a desired transfer of energy between batteries. In switching power converter 1100, duty cycle command $D_1$ represents the relative time that switching devices 908, 910 electrically couple resonant capacitor 920 between third terminal 906 and inductor 912 while switching devices 1138, 1140 simultaneously electrically couple second resonant capacitor 1142 between inductor 912 and first terminal 902. Duty cycle command $D_2$ represents the relative time that switching devices 908, 910 electrically couple resonant capacitor 920 between inductor 912 and first terminal 902 while switching devices 1138, 1140 simultaneously electrically couple second resonant capacitor 1142 between third terminal 906 and inductor 912. Power conversion control module 312 causes transfer of energy between batteries 306 by varying the ratio of $D_1$ to $D_2$.

Figure 6:
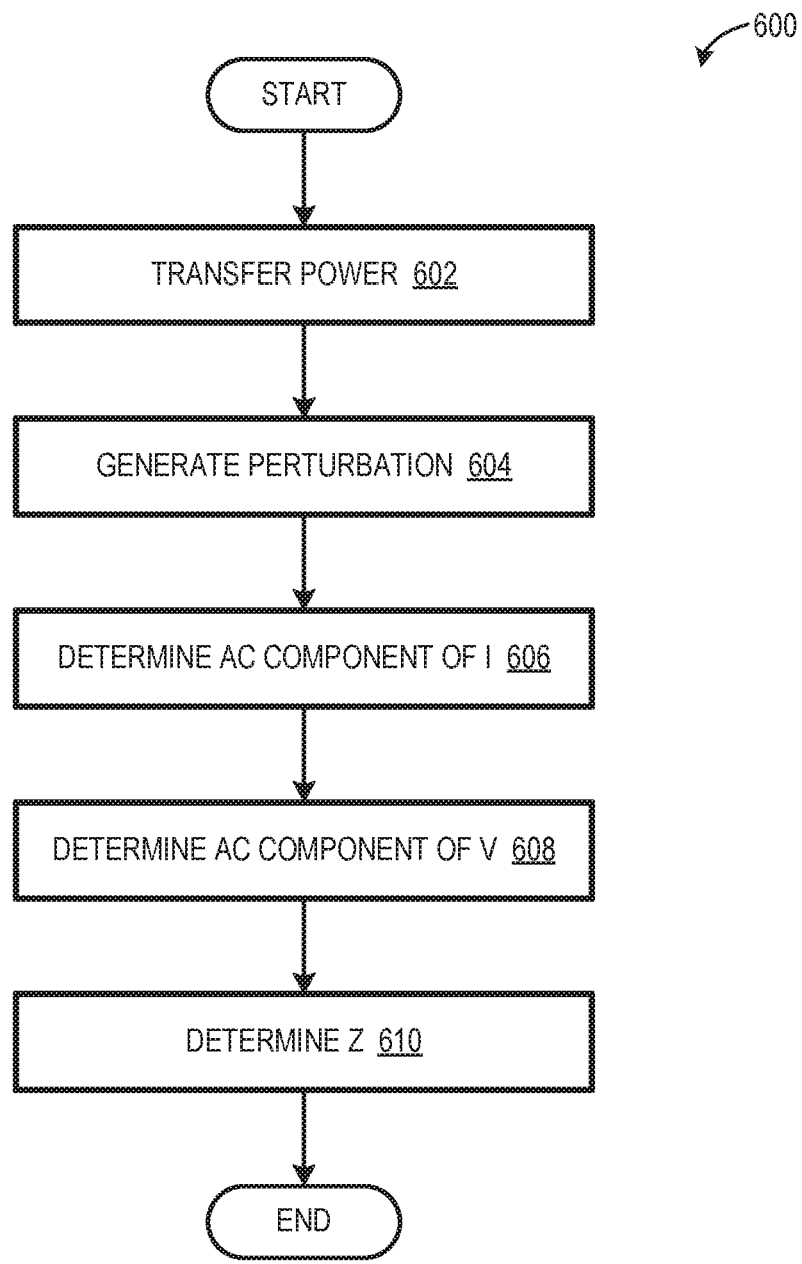
FIG. 6 illustrates a method for characterizing electrical impedance of an energy storage device, according to an embodiment.

FIG. 6 illustrates a method for characterizing electrical impedance of an energy storage device using power electronics-based EIS. In step 602, a switching power converter is controlled to transfer power between an energy storage device and other circuitry, such as a load, electrically coupled to the switching power converter. In one example of step 602, power conversion control module 312 controls $\Delta v$ of switching power converter 302(1) to at least substantially equalize energy stored in batteries 306 by transferring energy between adjacent batteries 306(1) and 306(2). In step 604, the switching power converter is controlled to generate a sinusoidal perturbation on electric current flowing through the energy storage device. In one example of step 604, perturbation control module 314 controls switching power converter 302(1) to generate sinusoidal perturbations at a plurality of frequencies on current flowing through battery 306(1). Steps 602 and 604 are optionally performed simultaneously.

In step 606, an AC component of electric current flowing through the energy storage device is determined, and in step 608, an AC component of voltage across the energy storage device is determined. In one example of step 606, current sensing module 316 generates a signal 324 representing magnitude and phase of AC current flowing through battery 306(1), and in one example of step 608, voltage sensing module 318 generates a signal 326 representing magnitude and phase of AC voltage across battery 306(1). In step 610, a complex impedance of the electric power source is determined based at least in part on the AC component of electric current flowing through the electric power source and the AC component of voltage across the electric power source. In one example of step 610, impedance determining module 320 determines complex impedance $z_{bat}$ of battery 306(1) from signals 324 and 326 at each frequency of the sinusoidal perturbations on current through the battery.

Combinations of Features

Features described above as well as those claimed below may be combined in various ways without departing from the scope hereof. The following examples illustrate some possible combinations:

(A1) A method for characterizing electrical impedance of an energy storage device may include the following steps: (a) controlling a first switching power converter to transfer electric power between a first energy storage device and a load, (b) controlling the first switching power converter to generate a sinusoidal perturbation on electric current flowing through the first energy storage device, (c) determining an alternating current (AC) component of the electric current flowing through the first energy storage device, (d) determining an AC component of voltage across the first energy storage device, and (e) determining a complex impedance of the first energy storage device based at least in part on the AC component of the electric current flowing through the first energy storage device and the AC component of the voltage across the first energy storage device.

(A2) In the method denoted as (A1), the steps (a) and (b) may be performed simultaneously.

(A3) In either of the methods denoted as (A1) or (A2), the first energy storage device may include a battery.

(A4) In any of the methods denoted as (A1) through (A3), step (b) may include controlling the first switching power converter to generate the sinusoidal perturbation on the electric current flowing through the first energy storage device at a plurality of frequencies, and step (e) may include determining the complex impedance of the first energy storage device at each of the plurality of frequencies.

(A5) Any of the methods denoted as (A1) through (A4) may further include determining one or more characteristics of the first energy storage device based at least in part on the complex impedance of the first energy storage device.

(A6) Any of the methods denoted as (A1) through (A5) may further include transferring energy between the first energy storage device and a second energy storage device using the first switching power converter.

(A7) The method denoted as (A6) may further include transferring energy between the second energy storage device and a third energy storage device using a second switching power converter.

(B1) A system for characterizing electrical impedance of an energy storage device may include a control subsystem and a first switching power converter for electrically coupling to a first energy storage device. The control subsystem may include a power conversion control module, a perturbation control module, a current sensing module, a voltage sensing module, and an impedance determining module. The power conversion control module may be configured to control the first switching power converter to transfer electric power between the first energy storage device and a load electrically coupled to the first switching power converter. The perturbation control module may be configured to control the first switching power converter to generate a sinusoidal perturbation on electric current flowing through the first energy storage device. The current sensing module may be configured to determine an alternating current (AC) component of the electric current flowing through the first energy storage device, and the voltage sensing module may be configured to determine an AC component of voltage across the first energy storage device. The impedance determining module may be configured to determine a complex impedance of the first energy storage device based at least in part on the AC component of the electric current flowing through the first energy storage device and the AC component of the voltage across the first energy storage device.

(B2) In the system denoted as (B1), the perturbation control module may be further configured to control the first switching power converter to generate the sinusoidal perturbation on the electric current flowing through the first energy storage device at a plurality of frequencies, and the impedance determining module may be further configured to determine the complex impedance of the first energy storage device at each of the plurality of frequencies.

(B3) In either of the systems denoted as (B1) or (B2), the first energy storage device may include a first battery, and the power conversion control module may be further configured to control the first switching power converter to control charging and discharging of the first battery.

(B4) In any of the systems denoted as (B1) through (B3), the control subsystem may further include a characteristic determining module configured to determine one or more characteristics of the first energy storage device based at least in part on the complex impedance of the first energy storage device.

(B5) In any of the systems denoted as (B1) through (B4), the power conversion control module may be further configured to control switching of the first switching power converter to transfer energy between the first energy storage device and a second energy storage device electrically coupled to first switching power converter.

(B6) In any of the systems denoted as (B5), the perturbation control module may be further configured to control the first switching power converter to generate a sinusoidal perturbation on electric current flowing through the second energy storage device, the current sensing module may be further configured to determine an AC component of the electric current flowing through the second energy storage device, the voltage sensing module may be further configured to determine an AC component of voltage across the second energy storage device, and the impedance determining module may be further configured to determine a complex impedance of the second energy storage device based at least in part on the AC component of the electric current flowing through the second energy storage device and the AC component of the voltage across the second energy storage device.

(B7) Any of the systems denoted as (B1) through (B4) may further include a second switching power converter for electrically coupling to a second energy storage device.

(B8) In any of the systems denoted as (B7), the power conversion control module may be further configured to control the second switching power converter to transfer electric power between the second electric energy storage device and other circuitry electrically coupled to the second energy storage device, the perturbation control module may be further configured to control the second switching power converter to generate a sinusoidal perturbation on electric current flowing through the second energy storage device, the current sensing module may be further configured to determine an AC component of the electric current flowing through the second energy storage device, the voltage sensing module may be further configured to determine an AC component of voltage across the second energy storage device, and the impedance determining module may be further configured to determine a complex impedance of the second energy storage device based at least in part on the AC component of the electric current flowing through the second energy storage device and the AC component of the voltage across the second energy storage device.

(B9) In any of the systems denoted as (B1) through (B8), the control subsystem may be at least partially implemented by a computing device including a processor and a memory, where the processor executes instructions in the form of software or firmware stored in the memory.

(B10) In any of the systems denoted as (B1) through (B9), the first switching power converter may have a buck-boost-type topology.

(B11) In any of the systems denoted as (B1) through (B9), the first switching power converter may have a resonant switched-capacitor-type converter topology.

Changes may be made in the above systems and methods without departing from the scope hereof. For example, switching power converters 302 may be modified to have a different topology and to connect to each other in a different manner than as illustrated herein. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method for characterizing electrical impedance of an energy storage device, comprising:
   (a) controlling a first switching power converter to transfer energy between a first battery and a second battery;
   (b) controlling a second switching power converter to transfer energy between the second battery and a third battery;
   (c) controlling the first switching power converter to generate a perturbation on electric current flowing through the first battery, the perturbation on the electric current flowing through the first battery including a sinusoidal component;
   (d) determining an alternating current (AC) component of the electric current flowing through the first battery;
   (e) determining an AC component of voltage across the first battery;
   (f) determining a complex impedance of the first battery based at least in part on the AC component of the electric current flowing through the first battery and the AC component of the voltage across the first battery;
   wherein:
     the first, second, and third batteries are electrically coupled in series to form a string of batteries, and
     determining the AC component of the electric current flowing through the first battery comprises determining the AC component from a difference between (a) an AC balancing current flowing to the first battery from the first switching power converter and (b) an AC current flowing between the string of batteries and circuitry external to the string of batteries.

2. The method of claim 1, wherein steps (a) and (c) are performed simultaneously.

3. The method of claim 1, step (c) including controlling the first switching power converter to generate the perturbation on the electric current flowing through the first battery at a plurality of frequencies, and step (f) including determining the complex impedance of the first battery at each of the plurality of frequencies.

4. The method of claim 1, further comprising:
   controlling at least one of the first switching power converter and the second switching power converter to generate a perturbation on electric current flowing through the second battery, the perturbation on the electric current flowing through the second battery including a sinusoidal component;
   controlling the second switching power converter to generate a perturbation on electric current flowing through the third battery, the perturbation on the electric current flowing through the third battery including a third component;
   determining an AC component of the electric current flowing through the second battery;
   determining an AC component of voltage across the second battery;

determining a complex impedance of the second battery based at least in part on the AC component of the electric current flowing through the second battery and the AC component of the voltage across the second battery;

determining an AC component of the electric current flowing through the third battery;

determining an AC component of voltage across the third battery; and determining a complex impedance of the third battery based at least in part on the AC component of the electric current flowing through the third battery and the AC component of the voltage across the third battery.

5. The method of claim 4, further comprising:

controlling at least one of the first switching power converter and the second switching power converter to generate the perturbation on the electric current flowing through the second battery at a plurality of second frequencies;

controlling the second switching power converter to generate the perturbation on the electric current flowing through the third battery at a plurality of third frequencies;

determining the complex impedance of the second battery at each of the plurality of second frequencies; and determining the complex impedance of the third battery at each of the plurality of third frequencies.

6. The method of claim 4, further comprising simultaneously determining the complex impedance of the second battery and the complex impedance of the third battery.

7. A system for characterizing electrical impedance of an energy storage device, comprising:

a first switching power converter for electrically coupling to each of a first battery and a second battery, wherein:
the first switching power converter comprises a first switching device, a second switching device, and a tank circuit,
the tank circuit includes an inductor and a capacitor, and
the inductor is electrically coupled to the capacitor via the first switching device and the second switching device;

a second switching power converter for electrically coupling to each of the second battery and a third battery; and a control subsystem, including:
a power conversion control module configured to control the first switching power converter and the second switching power converter to transfer energy between the first battery and the third battery via the second battery,
a perturbation control module configured to control the first switching power converter to generate a perturbation on electric current flowing through the first battery, the perturbation on the electric current flowing through the first battery including a sinusoidal component,
a current sensing module configured to determine an alternating current (AC) component of the electric current flowing through the first battery,
a voltage sensing module configured to determine an AC component of voltage across the first battery, and
an impedance determining module configured to determine a complex impedance of the first battery based at least in part on the AC component of the electric current flowing through the first battery and the AC component of the voltage across the first battery.

8. The system of claim 7, the perturbation control module being further configured to control the first switching power converter to generate the perturbation on the electric current flowing through the first battery at a plurality of frequencies, and the impedance determining module being further configured to determine the complex impedance of the first battery at each of the plurality of frequencies.

9. The system of claim 8, the power conversion control module being further configured to control the first switching power converter to control charging and discharging of the first battery.

10. The system of claim 7, the control subsystem being at least partially implemented by a computing device including a processor and a memory, where the processor executes instructions in the form of software or firmware stored in the memory.

11. The system of claim 7, the first switching power converter having a resonant switched-capacitor-type converter topology.

12. The system of claim 7, wherein:
the first switching power converter is configured to transfer energy between the first battery and the second battery; and
the second switching power converter is configured to transfer energy between the second battery and the third battery.

13. The system of claim 7, wherein:
the first battery, the second battery, and the third battery are electrically coupled in series; and
the power conversion control module is configured to control the first switching power converter and the second switching power converter to balance energy stored in each of the first battery, the second battery, and the third battery.

14. The system of claim 7, wherein:
the first, second, and third batteries are electrically coupled in series to form a string of batteries; and
the current sensing module is further configured to determine the AC component of the electric current flowing through the first battery from a difference between (a) an AC balancing current flowing to the first battery from the first switching power converter and (b) an AC current flowing between the string of batteries and circuitry external to the string of batteries.

15. The system of claim 7, wherein the inductor is electrically coupled between (a) a node that is common to each of the first battery and the second battery and (b) a node that is common to each of the first switching device and the second switching device.

16. The system of claim 7, wherein:
the perturbation control module is further configured to control at least one of the first switching power converter and the second switching power converter to generate a perturbation on electric current flowing through the second battery, the perturbation on the electric current flowing through the second battery including a sinusoidal component;
the perturbation control module is further configured to control the second switching power converter to generate a perturbation on electric current flowing through the third battery, the perturbation on the electric current flowing through the third battery including a sinusoidal component;

the current sensing module is further configured to determine an AC component of the electric current flowing through the second battery;

the voltage sensing module is further configured to determine an AC component of voltage across the second battery;

the impedance determining module is further configured to determine a complex impedance of the second battery based at least in part on the AC component of the electric current flowing through the second battery and the AC component of the voltage across the second battery;

the current sensing module is further configured to determine an AC component of the electric current flowing through the third battery;

the voltage sensing module is further configured to determine an AC component of voltage across the third battery; and the impedance determining module is further configured to determine a complex impedance of the third battery based at least in part on the AC component of the electric current flowing through the third battery and the AC component of the voltage across the third battery.

17. A system for characterizing electrical impedance of an energy storage device, comprising:
   a first switching power converter for electrically coupling to each of a first battery and a second battery;
   a second switching power converter for electrically coupling to each of the second battery and a third battery; and
   a control subsystem, including:
      a power conversion control module configured to control the first switching power converter and the second switching power converter to transfer energy between the first battery and the third battery via the second battery,
      a perturbation control module configured to control the first switching power converter to generate a perturbation on electric current flowing through the first battery, the perturbation on the electric current flowing through the first battery including a sinusoidal component,
      a current sensing module configured to determine an alternating current (AC) component of the electric current flowing through the first battery,
      a voltage sensing module configured to determine an AC component of voltage across the first battery, and
      an impedance determining module configured to determine a complex impedance of the first battery based at least in part on the AC component of the electric current flowing through the first battery and the AC component of the voltage across the first battery;
   wherein:
      the first switching power converter comprises a first switched capacitor stage, a second switched capacitor stage, and an inductor,
      the first switched capacitor stage and the second switched capacitor stage are electrically coupled in parallel with each other, and
      the inductor is electrically coupled between (a) a node that is common to each of the first battery and the second battery and (b) a node that is common to each of the first switched capacitor stage and the second switched capacitor stage.

18. The system of claim 17, wherein the power conversion control module is further configured to cause the first switched capacitor stage and the second switched capacitor stage to switch 180 degrees out-of-phase with respect to each other.

* * * * *